(12) United States Patent
Seyama et al.

(10) Patent No.: US 11,769,749 B2
(45) Date of Patent: Sep. 26, 2023

(54) MOUNTING APPARATUS

(71) Applicant: SHINKAWA LTD., Tokyo (JP)

(72) Inventors: Kohei Seyama, Tokyo (JP); Tetsuya Utano, Tokyo (JP)

(73) Assignee: SHINKAWA LTD., Tokyo (JP)

(*) Notice: Subject to any disclaimer, the term of this patent is extended or adjusted under 35 U.S.C. 154(b) by 83 days.

(21) Appl. No.: 17/427,098

(22) PCT Filed: Apr. 8, 2020

(86) PCT No.: PCT/JP2020/015887
§ 371 (c)(1),
(2) Date: Jul. 30, 2021

(87) PCT Pub. No.: WO2020/213502
PCT Pub. Date: Oct. 22, 2020

(65) Prior Publication Data
US 2022/0130796 A1 Apr. 28, 2022

(30) Foreign Application Priority Data
Apr. 15, 2019 (JP) .................................. 2019-077370

(51) Int. Cl.
*H01L 23/00* (2006.01)
*H05K 13/04* (2006.01)

(52) U.S. Cl.
CPC ........... *H01L 24/75* (2013.01); *H05K 13/046* (2013.01); *H05K 13/0409* (2018.08);
(Continued)

(58) Field of Classification Search
CPC ....... H01L 2224/73204; H01L 2224/75; H01L 2224/7555; H01L 2224/75745;
(Continued)

(56) References Cited

U.S. PATENT DOCUMENTS 11,512,411 B2 * 11/2022 Watanabe ................. D01F 6/12
2020/0388507 A1 * 12/2020 Seyama .................. H01L 21/50
(Continued)

FOREIGN PATENT DOCUMENTS

JP     H09272645     10/1997
JP     2003303855    10/2003
(Continued)

OTHER PUBLICATIONS

"International Search Report (Form PCT/ISA/210) of PCT/JP2020/015887," DATED Jun. 30, 2020, with English translation thereof, pp. 1-4.

*Primary Examiner* — Minh N Trinh
(74) *Attorney, Agent, or Firm* — JCIPRNET

(57) ABSTRACT

A mounting apparatus for mounting a semiconductor chip on a mounting body includes a stage on which the mounting body is placed, a mounting head provided to be movable up and down above the stage and pressing the semiconductor chip against the mounting body, and a film disposition mechanism which interposes a belt-like cover film between the mounting head and the stage, and the film disposition mechanism includes a film feeding part having a feeding reel around which at least the cover film has been wound, a film recovery part having a recovery reel also winding up at least the fed cover film, and one or more relay shafts provided in the course of a path of the cover film from the feeding reel to the recovery reel and by which the cover film is folded back in order to bend a moving direction of the cover film.

7 Claims, 8 Drawing Sheets

(52) U.S. Cl.
CPC .... *H01L 24/73* (2013.01); *H01L 2224/73204* (2013.01); *H01L 2224/7555* (2013.01); *H01L 2224/7598* (2013.01); *H01L 2224/75745* (2013.01)

(58) Field of Classification Search
CPC ... H01L 2224/7598; H01L 2224/83001; H01L 24/73; H01L 24/75; H05K 13/0408; H05K 13/0409; H05K 13/046
See application file for complete search history.

(56) References Cited

U.S. PATENT DOCUMENTS

2021/0175201 A1* 6/2021 Seyama ................. B65H 18/16
2022/0130796 A1* 4/2022 Seyama ............... H05K 13/046

FOREIGN PATENT DOCUMENTS

| JP | 2004165536 | 6/2004 |
| JP | 2006219226 | 8/2006 |
| JP | 2015035493 | 2/2015 |

\* cited by examiner

MOUNTING APPARATUS

CROSS-REFERENCE TO RELATED APPLICATION

This application is a 371 of international application of PCT application serial no. PCT/JP2020/015887, filed on Apr. 8, 2020, which claims the priority benefit of Japan application no. 2019-077370, filed on Apr. 15, 2019. The entirety of each of the above-mentioned patent applications is hereby incorporated by reference herein and made a part of this specification.

TECHNICAL FIELD

The present specification relates to a mounting apparatus for mounting a semiconductor chip on a mounting body.

BACKGROUND ART

Hitherto, a flip chip bonder technique for mounting a semiconductor chip on a mounting body which is a substrate or another semiconductor chip without using a wire is known. In such a flip chip bonder, a bonding material containing a thermosetting resin may be applied to a mounting body or a semiconductor chip in advance, and the semiconductor chip may be adhered to the mounting body using the bonding material. In this case, a bonding material extruded by the semiconductor chip at the time of heating and pressing the semiconductor chip by a mounting head may creep upward and adhere to the mounting head. In addition, even when the bonding material does not adhere to the mounting head, fume gases generated from the heated bonding material may infiltrate into the mounting head.

Patent Literature 1 discloses a mounting apparatus in which the bottom face of a thermocompression tool (mounting head) is covered with a film member (cover film) in order to prevent a bonding material from adhering to the thermocompression tool. That is, in the mounting apparatus disclosed in Patent Literature 1, a bonding head is provided with this thermocompression tool and a film member conveyance mechanism that sequentially feeds film members. According to such a mounting apparatus, a bonding material is effectively prevented from adhering to the thermocompression tool.

CITATION LIST

Patent Literature

[Patent Literature 1]
Japanese Patent Laid-Open No. 2015-35493
[Patent Literature 2]
Japanese Patent Laid-Open No. 2004-165536

SUMMARY

Problems to be Solved

However, in the related art such as Patent Literature 1, a belt-like film member is stretched linearly immediately under a thermocompression tool, and an unwinding roll and a winding roll are fixedly installed on both sides of the thermocompression tool. In other words, in the technique disclosed in Patent Literature 1, the degree of freedom in layout of an unwinding roll and a winding roll is low.

Meanwhile, Patent Literature 2 discloses a mounting apparatus in which a resin film (cover film) is provided separately from a bonding tool. However, in the mounting apparatus disclosed in Patent Literature 2, the resin film is used to protect a chip (semiconductor chip) from vibration of the bonding tool, but is not used to prevent a bonding material from adhering to the bonding tool. Further, also in the technique disclosed in Patent Literature 2, rollers for feeding and recovering a film are linearly stretched, and thus the degree of freedom in layout of these rollers is low.

Consequently, in the present specification, a mounting apparatus capable of improving the degree of freedom in layout of the respective members is disclosed.

Solution to Solve Problems

A mounting apparatus disclosed in the present specification is a mounting apparatus for mounting a semiconductor chip on a mounting body and includes a stage on which the mounting body is placed, a mounting head which is provided to be movable up and down above the stage and presses the semiconductor chip against the mounting body, and a film disposition mechanism which interposes a belt-like cover film between the mounting head and the stage, and the film disposition mechanism includes a film feeding part which includes a feeding reel around which the cover film has been wound, a film recovery part which includes a recovery reel winding up the fed cover film, and one or more relay shafts which are provided in the course of a path of the cover film from the feeding reel to the recovery reel and by which the cover film is folded back in order to bend a moving direction of the cover film, the one or more relay shafts extending in a direction in which an axial direction of the relay shaft is inclined with respect to a moving direction immediately before bending of the cover film.

In addition, the relay shaft may be disposed in a manner of the axial direction being inclined at 45 degrees with respect to the moving direction of the cover film immediately before bending.

In addition, the mounting apparatus may include an access opening for allowing an operator to access a mounting execution space, and both the feeding part and the recovery part may not be disposed behind the stage when seen from the access opening.

In addition, the film disposition mechanism may further include a film movement mechanism for moving at least two of the feeding part, the one or more relay shafts, and the recovery part in a horizontal direction in order to move the cover film crossing the stage in a horizontal direction.

In this case, at least one of the feeding part and the recovery part may be fixedly installed and may not be moved by the film movement mechanism.

In addition, the one or more relay shafts may include a first relay shaft and a second relay shaft which are disposed on both sides of the stage in a first direction, both the first relay shaft and the second relay shaft may be disposed such that axial directions of the first and second relay shafts are inclined at 45 degrees with respect to the moving direction of the cover film immediately before bending, and the film disposition mechanism may move the first relay shaft and the second relay shaft in association with each other in the same direction as a second direction orthogonal to the first direction.

In this case, the cover film forms substantially a U shape moving from the feeding reel to the recovery reel via the first and second relay shafts, and the first and second relay shafts may be disposed to be spaced apart from each other in the second direction.

Effect

According to a mounting apparatus disclosed in the present specification, a path of a cover film can be bent, and thus it is possible to further improve the degree of freedom in layout of the respective members.

DESCRIPTION OF EMBODIMENTS

Figure 1:
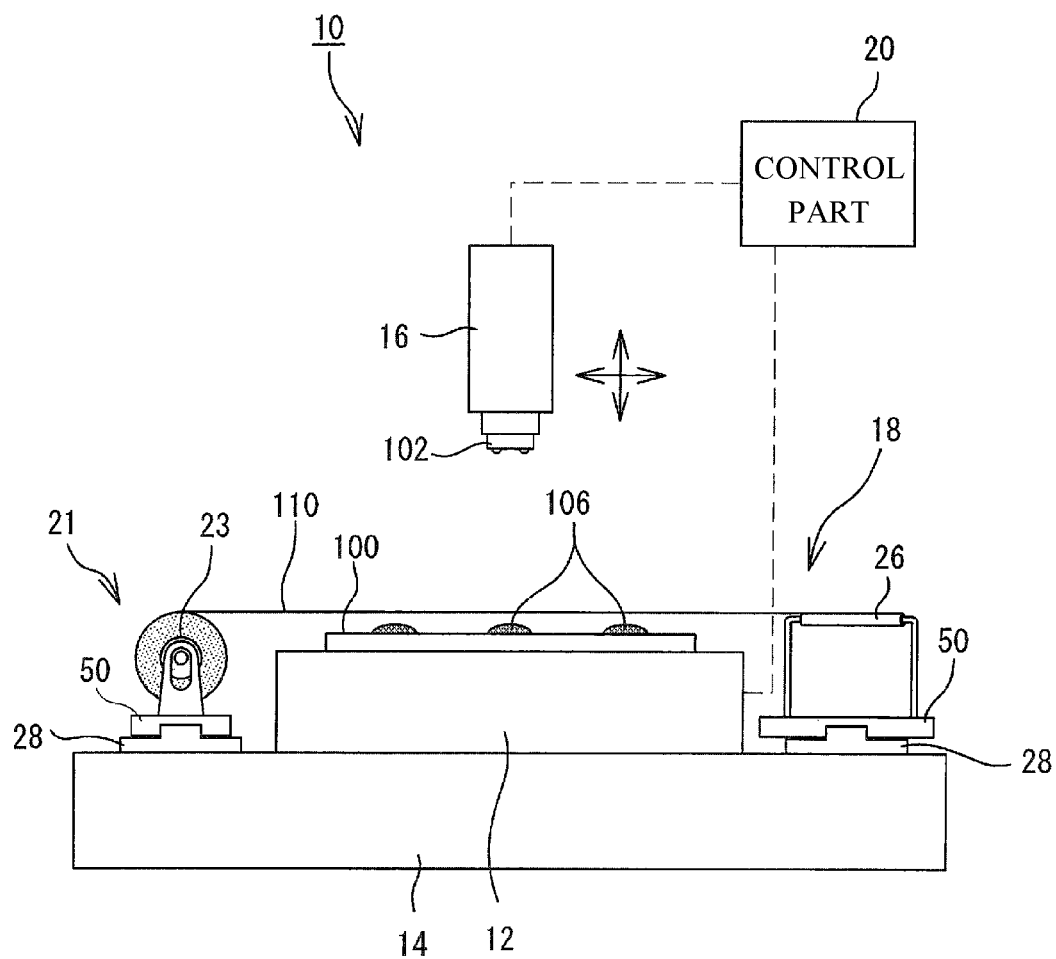
FIG. 1 is a schematic front view of a mounting apparatus.
Figure 2:
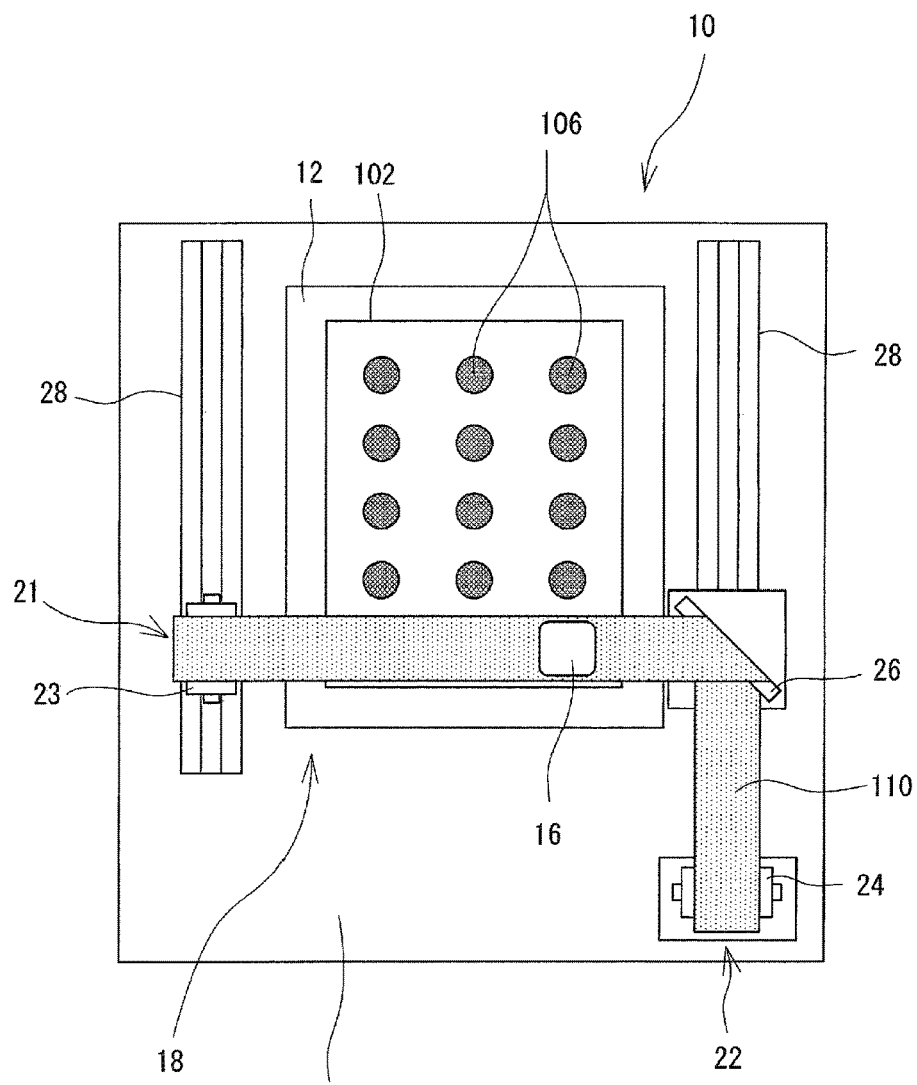
FIG. 2 is a schematic plan view of a mounting apparatus.
Figure 3:
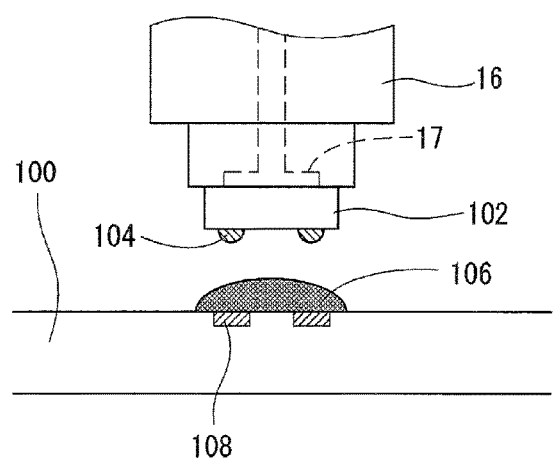
FIG. 3 is an image diagram illustrating the state of a temporary pressure bonding process.
Figure 4:
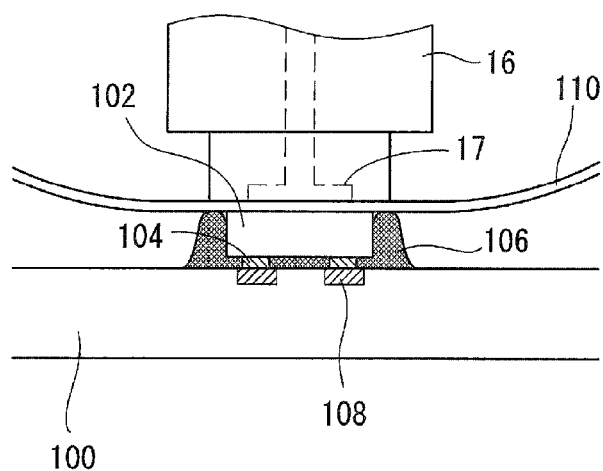
FIG. 4 is an image diagram illustrating the state of a main pressure bonding process.

Hereinafter, a configuration of a mounting apparatus 10 will be described with reference to the drawings. FIG. 1 is a schematic front view illustrating a basic configuration of the mounting apparatus 10, and FIG. 2 is a schematic plan view. Meanwhile, for ease of viewing, a recovery part 22 is not illustrated in FIG. 1. In addition, FIG. 3 is a diagram illustrating the state of a temporary pressure bonding process, and FIG. 4 is a diagram illustrating the state of a main pressure bonding process.

The mounting apparatus 10 is an apparatus that manufactures a semiconductor device by mounting a plurality of semiconductor chips 102 on a mounting body which is a substrate or another semiconductor chip. Hereinafter, a case where a substrate 100 is used as a mounting body will be described as an example. The semiconductor chip 102 is mounted on a substrate by a flip chip bonder technique. Specifically, as illustrated in FIGS. 3 and 4, a protrusion formed of a conductive material called a bump 104 is formed on the bottom face of each semiconductor chip 102, and the bump 104 is bonded to an electrode 108 formed on the surface of the substrate 100, whereby the semiconductor chip 102 and the substrate 100 are electrically connected to each other.

In general, a plurality of semiconductor chips 102 are mounted on one substrate 100 in a two-dimensional array. The electrode 108 electrically connected to the bump 104 is formed at a location where the semiconductor chip 102 is mounted on the substrate 100. In addition, a bonding material 106 formed of a nonconductive thermosetting material (for example, a nonconductive paste (NCP), a nonconductive film (NCF), or the like) is provided in advance on the top face of the substrate 100 or the bottom face of the semiconductor chip 102. The semiconductor chip 102 is heated and pressed against the substrate 100 in a state where the bonding material 106 is interposed between the semiconductor chip 102 and the substrate 100, and thus the bonding material 106 is hardened and the semiconductor chip 102 is mechanically adhered and fixed to the substrate 100.

The mounting apparatus 10 executes a temporary pressure bonding process and a main pressure bonding process at the time of mounting the semiconductor chip 102 on the substrate 100. The temporary pressure bonding process is a process of temporarily placing the semiconductor chip 102 on the substrate 100. Further, in the main pressure bonding process, the temporarily pressure-bonded semiconductor chip 102 is heated and pressed to mechanically and electrically connect the semiconductor chip 102 to the substrate 100. In the main pressure bonding process, the semiconductor chip 102 is heated to a temperature equal to or higher than a hardening temperature of the bonding material 106 and a temperature equal to or higher than a melting temperature of the bump 104. In the present example, a temporary pressure bonding process is continuously executed on the plurality of semiconductor chips 102, and then a main pressure bonding process is continuously executed on the plurality of temporarily pressure-bonded semiconductor chips 102.

The mounting apparatus 10 is an apparatus for mounting the semiconductor chip 102 on the substrate 100 according to the above-described procedure. The mounting apparatus 10 includes a stage 12, a mounting head 16, a film disposition mechanism 18, and a control part 20 that controls the driving of these parts.

The stage 12 is a part on which the substrate 100 (mounting body) is placed. The stage 12 is provided with, for example, a suction hole for suctioning and holding the substrate 100, a heater for heating the substrate 100 (both are not shown in the drawing), and the like. The stage 12 is supported by a base 14.

The mounting head 16 is provided to face the stage 12 and is movable to the stage 12 in a horizontal direction and a vertical direction. As illustrated in FIG. 3, a suction hole 17 for suctioning and holding the semiconductor chip 102 is formed in a tip end surface of the mounting head 16. The suction hole 17 communicates with a suction pump not shown in the drawing, and the semiconductor chip 102 is suctioned and held by the tip end surface of the mounting head 16 due to negative pressure generated by the suction pump. In addition, a heater (not shown) for heating the suctioned and held semiconductor chip 102 is provided inside the mounting head 16.

In the temporary pressure bonding process, the mounting head 16 receives the semiconductor chip 102 from a chip supply source not shown in the drawing, places the semiconductor chip 102 at a mounting position on the substrate 100, and heats and presses the semiconductor chip 102 to temporarily pressure-bond the semiconductor chip 102 to the substrate 100. A heating temperature during the temporary pressure bonding is equal to or higher than a softening start temperature at which the bonding material 106 starts to be softened and equal to or lower than a hardening start temperature at which the bonding material 106 starts to be hardened. Further, in the main pressure bonding process, the mounting head 16 heats and presses the semiconductor chip 102 temporarily pressure-bonded to the substrate 100 to perform main pressure bonding of the semiconductor chip 102 on the substrate 100. A heating temperature during the main pressure bonding is equal to or higher than a melting temperature at which the bump 104 melts and equal to or higher than a hardening start temperature of the bonding material 106. In addition, a pressing force during the main pressure bonding process is greater than a pressing force during the temporary pressure bonding process.

Incidentally, as described above, the mounting head 16 presses the semiconductor chip 102 against the substrate 100 during the main pressure bonding process. In this case, as illustrated in FIG. 4, a portion of the bonding material 106 extruded to the outside by the semiconductor chip 102 may protrude and creep upward. When the bonding material 106 creeping upward adheres to the mounting head 16, there is a concern that the subsequent mounting process may not be performed appropriately. In addition, even when the bonding material 106 does not adhere to the mounting head 16, fume gases generated from the heated bonding material 106 may enter the suction hole 17 of the mounting head 16, and thus the mounting head 16 may become contaminated.

Consequently, in the mounting apparatus 10 disclosed in the present specification, a cover film 110 is interposed between the mounting head 16 and the semiconductor chip 102 during the main pressure bonding process. The cover film 110 is provided as illustrated in FIG. 4, and thus the adhesion of the bonding material 106 to the mounting head 16 and the infiltration of a fume gas into the suction hole 17 of the mounting head 16 are effectively prevented. Meanwhile, as a matter of course, when the suction hole 17 is covered with the cover film 110 interposed between the mounting head 16 and the semiconductor chip 102, the semiconductor chip 102 cannot be suctioned and held by the mounting head 16. For this reason, in the temporary pressure bonding process in which the mounting head 16 suctions and holds the semiconductor chip 102, the cover film 110 retreats to a position spaced apart from the semiconductor chip 102 and the mounting head 16 in a horizontal direction.

The mounting apparatus 10 is provided with a film disposition mechanism 18 in which the cover film 110 is interposed between the temporarily pressure-bonded semiconductor chip 102 and the mounting head 16 during the main pressure bonding process. The cover film 110 has an elongate belt shape in one direction and has a width larger than the width of one semiconductor chip 102. In addition, the cover film 110 has a property of having sufficient heat resistance to withstand a melting temperature and a hardening start temperature of a material having excellent detachability from the bonding material 106. Specifically, the cover film 110 is formed of, for example, a fluororesin such as polytetrafluoroethylene (PTFE) or tetrafluoroethylene perfluoroalkyl vinyl ether copolymer (PFA).

The film disposition mechanism 18 includes a feeding part 21 that feeds an unused cover film 110, a recovery part 22 that recovers a used cover film 110, a relay shaft 26 which is provided in the course of the path of the cover film 110, and a film movement mechanism 28 that moves the cover film 110 in a horizontal direction. The feeding part 21 is a part that feeds the unused cover film 110 and includes at least a feeding reel 23 around which the unused cover film 110 has been wound. In addition, the recovery part 22 is a part that recovers the used cover film 110 and includes at least a recovery reel 24 around which the used cover film 110 has been wound.

The relay shaft 26 is provided in the course of the path of the cover film 110 from the feeding reel 23 to the recovery reel 24. As illustrated in FIG. 2, the relay shaft 26 is disposed such that the axial direction of the relay shaft 26 is inclined at 45 degrees in the moving direction of the cover film 110 toward the relay shaft 26. The cover film 110 is folded back at the relay shaft 26, so that the moving direction thereof is bent by approximately 90 degrees. Therefore, the axial direction of the relay shaft 26 is inclined at 45 degrees in the moving direction of the cover film 110 before and after the bending.

Meanwhile, the cover film 110 moves forward while sliding on the surface of the relay shaft 26 in association with the feeding of the cover film. For this reason, the relay shaft 26 is configured as a non-rotating shaft so that the cover film 110 smoothly slides on the surface of the relay shaft 26. In addition, the surface of the relay shaft 26 has an appropriate sliding property, and surface processing for improving a sliding property, for example, fluororesin processing, ceramic coating processing, or the like may be performed on, for example, the surface of the relay shaft 26.

Here, in the examples of FIGS. 1 and 2, only one relay shaft 26 is provided on a side opposite to the feeding reel 23 with the stage 12 interposed therebetween. For this reason, the cover film 110 is bent only once at approximately 90 degrees on the way from the feeding reel 23 to the recovery reel 24, and as a whole, the cover film 110 moves forward through a path having substantially an L-shape when seen in a plan view. Further, in this case, the rotation axis of the recovery reel 24 is inclined at 90 degrees with respect to the rotation axis of the feeding reel 23. However, as will be described later, the number of relay shafts 26 is not limited to one and may be two or more.

Figure 5:
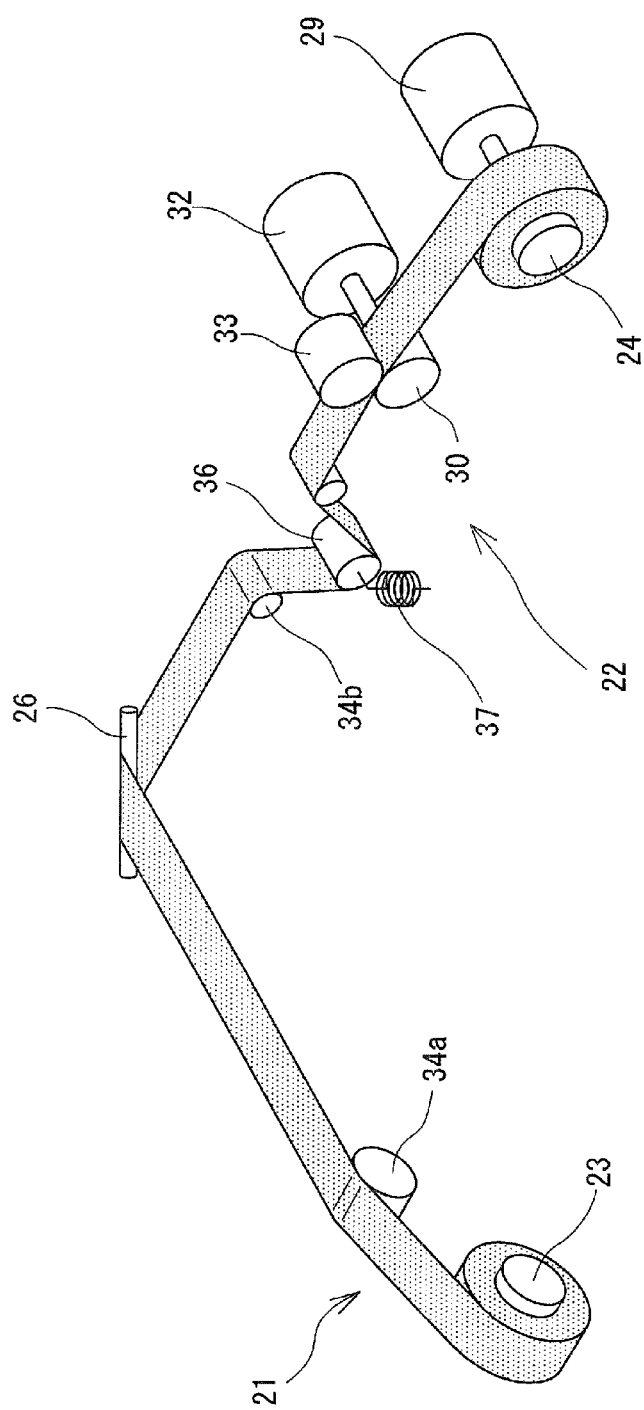
FIG. 5 is a perspective view illustrating more specific configurations of a feeding part and a recovery part.

Further, in order to make this easy to see, only the feeding reel 23 and the recovery reel 24 are illustrated in FIGS. 1 and 2 as the feeding part 21 and the recovery part 22, but the feeding part 21 and the recovery part 22 are often provided with an additional driving source or roller in order to appropriately feed and recover the cover film 110. FIG. 5 is a perspective view illustrating more specific configurations of the feeding part 21 and the recovery part 22. As illustrated in FIG. 5 and as described above, the cover film 110 is wound around the recovery reel 24 via the relay shaft 26 from the feeding reel 23.

The diameter of a film roll constituted by the cover film 110 wound around the feeding reel 23 and the recovery reel 24 fluctuates in association with the feeding and recovery of the cover film 110. Naturally, when the diameter of the film roll fluctuates, the amount of feeding and recovery of the film per one rotation of the reel changes. In order to absorb such a fluctuation in the amount of feeding and recovery per one rotation, the amount of feeding and recovery of the cover film 110 may be adjusted by connecting a motor of which the rotation speed can be controlled to at least one of the feeding reel 23 and the recovery reel 24 and adjusting the rotation speed of the motor. However, in this case, a sensor that detects the diameter of the film roll is required, and thus motor control tends to be complicated.

Consequently, in order to facilitate motor control, the recovery part 22 may be further provided with a driving roller 30 and a driven roller 33 that pinch the cover film 110 as illustrated in FIG. 5. The driving roller 30 and the driven roller 33 are provided immediately upstream of the recovery reel 24. The driven roller 33 pinches the cover film 110 in cooperation with the driving roller 30 and is rotated following the rotation of the driving roller 30. The driving roller 30 is connected to the driving motor 32 and is able to rotate at a constant speed. The driving roller 30 is rotated at a constant speed, and thus the cover film 110 is transmitted to the recovery reel 24 side at a constant speed.

In this case, a recovery motor 29 is connected to the recovery reel 24, and the recovery reel 24 is rotated in association with the driving of the recovery motor 29 and also winds up the cover film 110 transmitted from the driving roller 30. In this case, the recovery speed of the cover film 110 is secured by the driving roller 30, and thus it is not necessary to perform complex speed control on the recovery motor 29. Further, in this case, the feeding reel 23 may be configured to be rotated following the drawing out of the cover film 110.

In addition, at least one of the feeding part 21 and the recovery part 22 may be further provided with a tension roller 36 that keeps the tension of the cover film 110 constant. In the example of FIG. 5, the recovery part 22 may be provided with the tension roller 36. The tension roller 36 is provided in the course of the path of the cover film 110 and provided upstream of the driving roller 30. The tension roller 36 is biased by biasing means such as a spring 37 in a direction in which the cover film 110 becomes tense. In the example of FIG. 5, the tension roller 36 presses the cover film 110 from above and is biased downward by the spring 37. It is possible to easily keep the tension of the cover film 110 constant by providing the tension roller 36.

Further, at least one of the feeding part 21 and the recovery part 22 may be provided with an adjustment roller that adjusts the height position of the cover film 110 (the position in a vertical direction with respect to the surface of the cover film 110). It is possible to stretch the cover film 110 at the same height position by providing the adjustment roller even when the diameter of the film roll formed in the feeding reel 23 and the recovery reel 24 changes. In the example of FIG. 5, a first adjustment roller 34a is provided immediately downstream of the feeding reel 23, and a second adjustment roller 34b is provided immediately upstream of the tension roller 36.

The film disposition mechanism 18 will be described again with reference to FIGS. 1 and 2. As is apparent from FIGS. 1 and 2, in the present example, the feeding reel 23 and the relay shaft 26 are disposed on both sides of the stage 12. For this reason, the cover film 110 crosses the stage 12 and the substrate 100 placed on the stage 12 in one direction (the X direction in the example illustrated in the drawing). At the stage before the main pressure bonding process is started, a plurality of semiconductor chips 102 are temporarily pressure-bonded onto the substrate 100 in a two-dimensional array. For this reason, the cover film 110 covers the upper parts of the semiconductor chips 102 of one row.

The film disposition mechanism 18 further includes a film movement mechanism that moves the feeding part 21 and the relay shaft 26 in the Y direction so as to be capable of sequentially changing a row covered with the cover film 110. The film movement mechanism moves the cover film 110 crossing the stage 12 in the horizontal direction by moving two parts disposed on both sides of the stage 12 (the feeding part 21 and the relay shaft 26 in the present example) among the feeding part 21, the relay shaft 26, and the recovery part 22 in the horizontal direction. A specific configuration of the film movement mechanism is not particularly limited, but a direct-acting mechanism for advancing and retracting a plate 50 connected to, for example, the feeding part 21 and the relay shaft 26 in one direction may be included. Various known mechanisms can be used as the direct-acting mechanism, and the direct-acting mechanism may include, for example, a pair of pulleys rotated by a motor and a timing belt stretched over the pulleys. In addition, the direct-acting mechanism may include a spline shaft rotated by a motor, a guide shaft extending parallel to the spline shaft, and a moving block to which the spline shaft is screwed and into which the guide shaft is inserted. Further, as another mode, the direct-acting mechanism may include a linear motor, a hydraulic cylinder, an air cylinder, an electromagnetic cylinder, or the like.

The control part 20 controls the driving of the mounting head 16, the film disposition mechanism 18, and the stage 12 described above. The control part 20 includes, for example, a processor (for example, a CPU) that performs various computations and a memory that also stores various data and programs. Detection results obtained by various sensors are input to the control part 20, and the control part 20 performs driving control of each part in accordance with the detection results. More specifically, the control part 20 performs movement control of the mounting head 16, temperature control of the heaters of the mounting head 16 and the stage 12, driving control of a suction mechanism, and the like. In addition, the control part 20 also performs driving control of the film disposition mechanism 18 in order to dispose the cover film 110 at an appropriate position.

Figure 6:
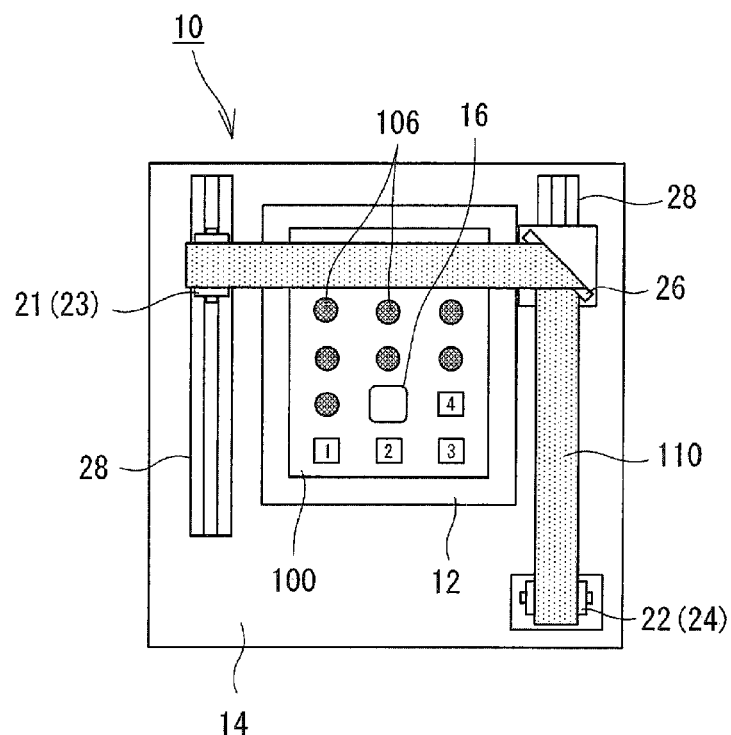
FIG. 6 is a schematic plan view illustrating the state of a temporary pressure bonding process.
Figure 7:
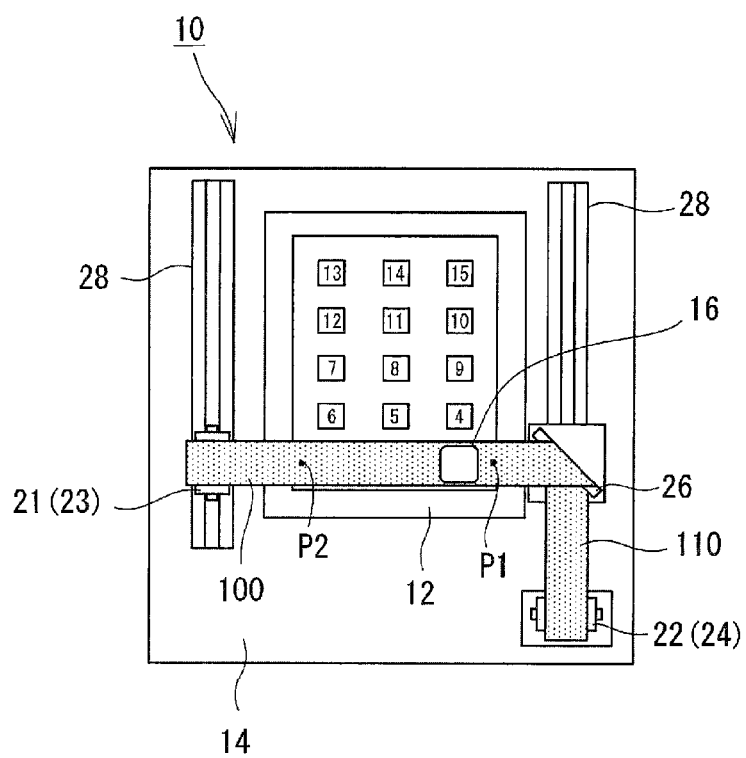
FIG. 7 is a schematic plan view illustrating the state of a main pressure bonding process.
Figure 8:
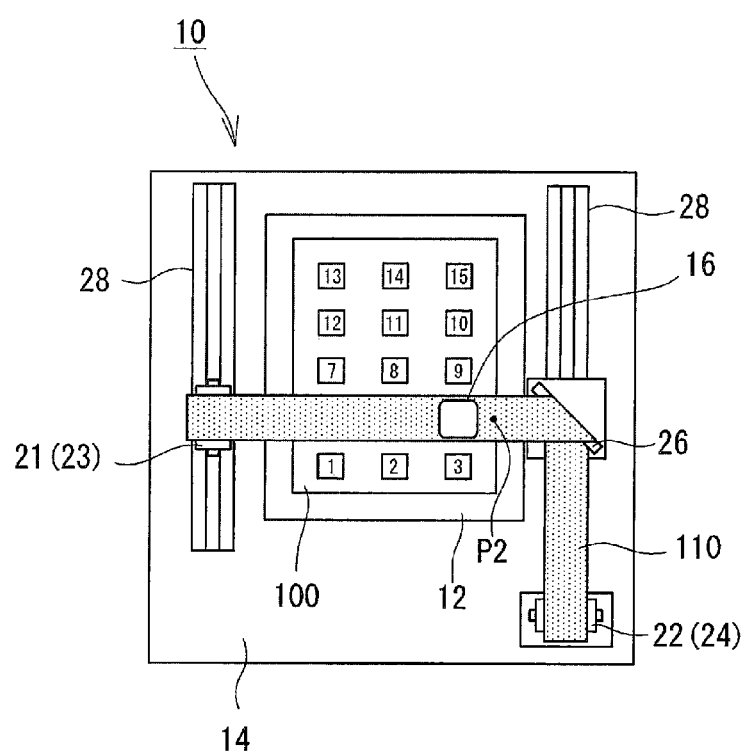
FIG. 8 is a schematic plan view illustrating the state of a main pressure bonding process.

Next, a flow of mounting of the semiconductor chip 102 using the mounting apparatus 10 will be described with reference to FIGS. 6 to 8. FIGS. 6 to 8 are schematic plan views illustrating a state during mounting, FIG. 5 illustrates the state of a temporary pressure bonding process, and FIGS. 7 and 8 illustrate the state of a main pressure bonding process.

As described above, the bonding material 106 is previously applied to a mounting location on the semiconductor chip 102 on the surface of the substrate 100. The control part 20 drives the mounting head 16 to temporarily pressure-bond the semiconductor chip 102 to each mounting location on the substrate 100. Specifically, the mounting head 16 is moved to a chip supply source not shown in the drawing to suction and hold a new semiconductor chip 102 on a tip end surface thereof. Subsequently, the mounting head 16 is moved immediately above the corresponding mounting location. Thereafter, the mounting head 16 descends toward the substrate 100 as illustrated in FIG. 3 and pushes the suctioned and held semiconductor chip 102 above the corresponding mounting location (and the bonding material 106) to temporarily pressure-bonds the semiconductor chip 102.

When one semiconductor chip 102 can be temporarily pressure-bonded, the mounting head 16 releases the suction of the semiconductor chip 102 and ascends. Thereafter, the mounting head 16 sequentially performs the temporary pressure bonding of all of the semiconductor chips 102 according to the same procedure. In FIG. 6, numerals referring to each of semiconductor chips 102 indicate the order of temporary pressure bonding. As is apparent from FIG. 6, in the example illustrated in the drawing, the semiconductor chips 102 are temporarily pressure-bonded from a lower left corner. Then, temporary pressure bonding of the semiconductor chips 102 is performed in a zigzag shape while reversing a moving direction for each row.

Here, when the temporary pressure bonding process is performed, the control part 20 drives the film movement mechanism 28 to retract the cover film 110 to a position separated in a horizontal direction from a location where temporary pressure bonding is scheduled to be performed. In the present example, the cover film 110 can be retracted by moving the feeding part 21 and the relay shaft 26 disposed on both sides of the stage 12 to a position separated in a horizontal direction from the mounting head 16. In this manner, the cover film 110 is separated in a horizontal direction from a location where temporary pressure bonding is scheduled to be performed during the temporary pressure bonding process, and thus it is possible to appropriately suction and hold the semiconductor chip 102 by the mounting head 16 because the suction hole 17 of the mounting head 16 is not covered with the cover film 110.

When all of the semiconductor chips 102 have been temporarily pressure-bonded, the control part 20 subsequently causes the mounting head 16 to execute a main pressure bonding process. Specifically, the mounting head 16 sequentially presses the temporarily pressure-bonded semiconductor chips 102 against the substrate 100 and heats the semiconductor chips 102 to perform main pressure bonding. In FIGS. 7 and 8, numerals referring to each of semiconductor chips 102 indicate the order of main pressure bonding. In the example illustrated in the drawing, main pressure bonding is started from a lower left corner similar to the temporary pressure bonding, and thereafter, the main pressure bonding is performed in a zigzag shape while reversing a moving direction for each row.

Here, when the main pressure bonding process is performed, the control part 20 drives the film movement mechanism 28 to interpose the cover film 110 between the mounting head 16 and the semiconductor chip 102 to be subjected to main pressure bonding. Since the cover film 110 is interposed at such a position, it is thus possible to effectively prevent the bonding material 106 creeping upward from adhering to the mounting head 16 and prevent fume gases from infiltrating into the mounting head 16 during the main pressure bonding as illustrated in FIG. 4.

Here, the semiconductor chip 102 to be subjected to the main pressure bonding changes sequentially. Therefore, the position of the cover film 110 also has to be sequentially changed in accordance with the progress of the main pressure bonding process. However, in the present example, the cover film 110 is stretched to cover (three) semiconductor chips 102 of one row. Therefore, the film movement mechanism 28 does not move the cover film 110 (the feeding part 21 and the relay shaft 26) until main pressure bonding to be performed on (three) semiconductor chips 102 of one row which are positioned immediately below the cover film 110 is terminated, and moves the cover film 110 immediately above the adjacent next row when main pressure bonding to be performed on all of the semiconductor chips 102 positioned immediately below the cover film 110 is terminated.

According to the examples illustrated in FIGS. 7 and 8, when main pressure bonding is performed on semiconductor chips 102 of a second row from the bottom in the drawing, the film movement mechanism 28 positions the cover film 110 immediately above a mounting location of the second column as illustrated in FIG. 7. In addition, when a main pressure bonding process to be performed on all of the semiconductor chips 102 of the second column is terminated, the film movement mechanism positions the cover film 110 (the feeding part 21 and the relay shaft 26) immediately above a mounting location of a first row from the bottom in the drawing as illustrated in FIG. 8.

In addition, the feeding and recovery of the cover film 110 are also performed in association with horizontal movement of the cover film 110 by the film movement mechanism 28. Specifically, when a main pressure bonding process to be performed on semiconductor chips 102 of one column is terminated, the recovery part 22 drives the recovery motor 29 and the driving motor 32 to recover the cover film 110 by a distance corresponding to one column of a mounting location. In the example of FIG. 7, a position P1 on the cover film 110 is in the vicinity of one end of the substrate 100, and a position P2 is in the vicinity of the other end of the substrate 100. The recovery part 22 recovers the cover film 110 by a distance from the position P1 to the position P2.

Since the feeding reel 23 is also rotated in association with the recovery, an unused cover film 110 corresponding to the same distance as the recovery distance is fed. Thereby, the unused cover film 110 is disposed immediately above the substrate 100.

Further, in a case where the cover film 110 is horizontally moved in a direction away from the recovery part 22, a path distance of the cover film 110 from the feeding part 21 to the recovery part 22 is increased. A surplus of the cover film 110 needs to be drawn out according to the increased path distance. Consequently, when the cover film 110 is horizontally moved in a direction away from the recovery part 22, the cover film 110 is reeled off from the feeding reel 23 or the recovery reel 24 by the same distance as the movement distance. For example, when the cover film 110 moves horizontally in a direction away from the recovery part 22, the used cover film 110 may be reeled off from the recovery reel 24 by driving the driving motor 32 in reverse to reversely rotate the driving roller 30. In addition, when the cover film 110 moves horizontally in a direction toward the recovery part 22, the cover film 110 is loosened by the movement distance. Accordingly, in this case, a surplus of the cover film 110 is wound according to the movement distance.

Incidentally, as is apparent from the above description, in the present example, the relay shaft 26 for bending the moving direction of the cover film 110 is provided in the course of the path of the cover film 110. In the present example, in order to simplify description, the number of relay shafts 26 is set to be one, but the number of relay shafts 26 and the positions thereof may be appropriately adjusted, whereby the degree of freedom of the design of the path of the cover film 110 is improved. Thereby, the degree of freedom of layouts of the feeding part 21 and the recovery part 22 is improved.

That is, in a case where the relay shaft 26 is not provided, the cover film 110 needs to advance substantially linearly from the feeding reel 23 to the recovery reel 24, and the positions of the feeding part 21 and the recovery part 22 are limited to both sides of the stage 12. However, as described so far, the feeding part 21 and the recovery part 22 are provided with a plurality of rollers, a motor, biasing means, and the like in order to appropriately feed and recover the cover film 110, and thus the feeding part 21 and the recovery part 22 tend to become large and complicated as compared to the relay shaft 26. Depending on the type of mounting apparatus 10, a sufficient space for installing the feeding part 21 and the recovery part 22 that tend to become large may not be able to be secured on both sides of the stage 12.

In addition, the configurations of the feeding part 21 and the recovery part 22 are complicated as compared to that of the relay shaft 26, and thus it is necessary to perform maintenance more frequently. Such maintenance also includes replacement of film rolls attached to the feeding reel 23 and the recovery reel 24. In a case where both the feeding part 21 and the recovery part 22 are disposed on both sides of the stage 12, it becomes difficult for a user to access the feeding part 21 and the recovery part 22, and thus it may be difficult to perform maintenance. On the other hand, as in the present example, when the relay shaft 26 for bending the moving direction of the cover film 110 is provided, it is possible to comparatively freely move the positions of the feeding part 21 and the recovery part 22 and drastically improve the degree of freedom of the layouts thereof.

In addition, as is apparent from the above description, it is necessary to move the cover film 110 in a horizontal direction depending on the progress of a main pressure bonding process. In a configuration in which the relay shaft 26 is not provided and the feeding part 21 and the recovery part 22 are disposed on both sides of the stage 12, both the feeding part 21 and the recovery part 22 have to be moved in order to move the cover film 110 horizontally. However, as described above, the feeding part 21 and the recovery part 22 are large and complicated, and thus the film movement mechanism 28 tends to become large and complicated in a case where both the feeding part 21 and the recovery part 22 are moved horizontally by the film movement mechanism 28.

On the other hand, in the present example, the relay shaft 26 is provided on a side opposite to the feeding part 21 with the stage 12 interposed therebetween. In addition, the relay shaft 26 is moved horizontally together with the feeding part 21, while the position of the recovery part 22 is fixed. Thereby, a configuration for moving the large-sized recovery part 22 is not necessary, and thus it is possible to reduce the size and cost of the entire mounting apparatus 10.

Figure 9:
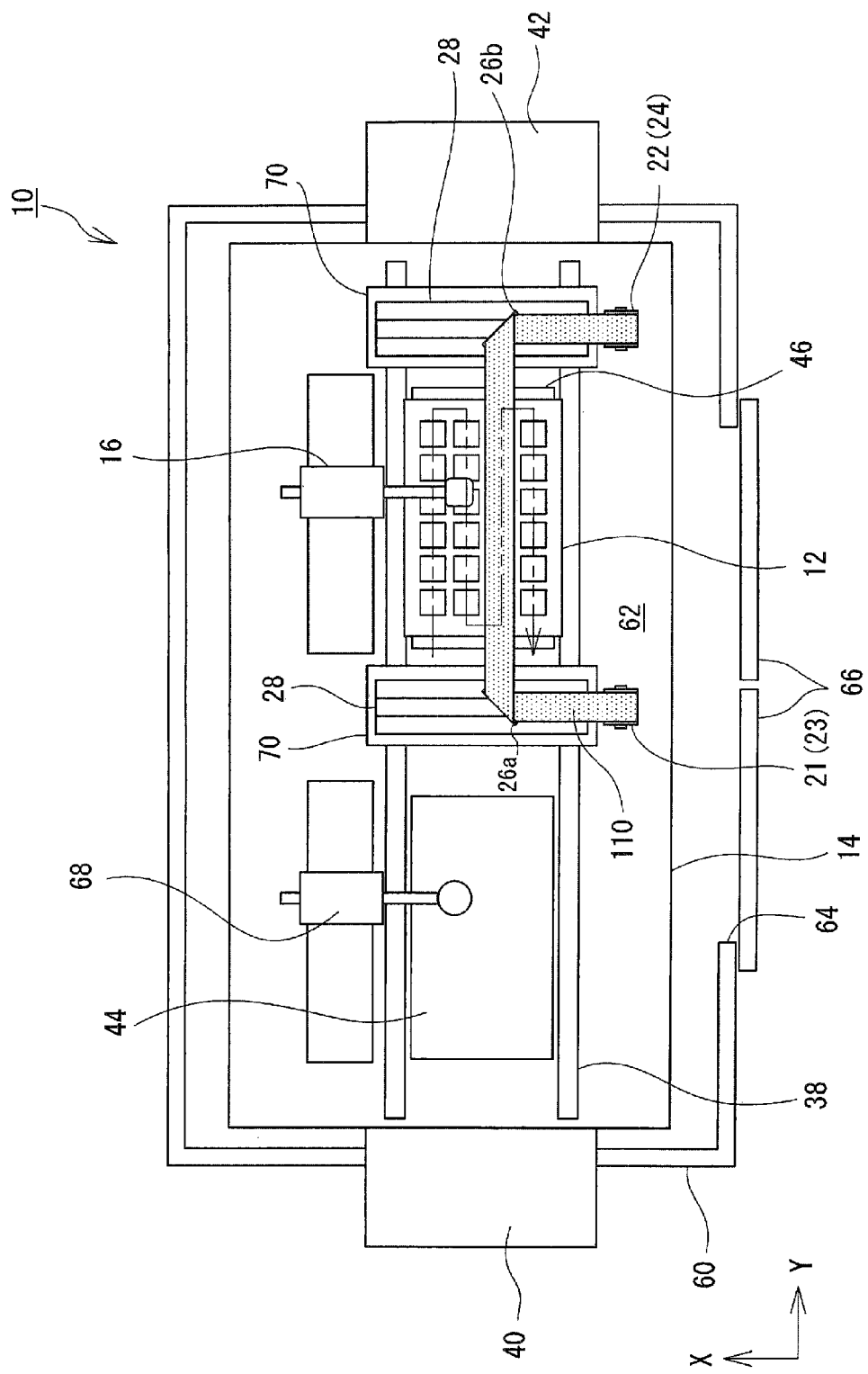
FIG. 9 is a schematic plan view of another mounting apparatus.

Next, a configuration of another mounting apparatus 10 will be described with reference to FIG. 9. FIG. 9 is a schematic plan view of another mounting apparatus 10. The mounting apparatus 10 is covered with a cover 60, and a mounting execution space 62 for mounting a semiconductor chip 102 on a substrate 100 is formed inside the cover 60. An access opening 64 having a door 66 attached thereto is provided on the front surface of the cover 60 such that the door 66 communicates with the inside and outside of the mounting apparatus 10 and can be opened and closed. An operator accesses the inside of the mounting execution space 62 through the access opening 64.

A base 14 which is elongate in a width direction is provided inside the mounting execution space 62, and a substrate conveyance rail 38 for conveying the substrate 100 from one end to the other end in a width direction (conveying the substrate in the Y direction in the drawing) is provided on the base 14. A loader 40 that supplies the substrate 100 to the mounting apparatus 10 and an unloader 42 that recovers the substrate 100 after mounting processing from the mounting apparatus 10 are provided on both sides of the mounting apparatus 10 in a width direction. The substrate 100 supplied to the mounting apparatus 10 by the loader 40 is conveyed to the unloader 42 side along the substrate conveyance rail 38.

A prestage 44 and a bonding stage 46 are sequentially provided in the course of a conveyance path of the substrate 100 from an upstream side. The prestage 44 heats the substrate 100 prior to a temporary pressure bonding process. A dispenser 68 for applying a bonding material 106 to a predetermined location on the substrate 100 is provided behind the prestage 44 when seen from the access opening 64. The dispenser 68 applies the bonding material 106 onto the substrate 100 in a two-dimensional array.

The bonding stage 46 is provided downstream of the prestage 44. The bonding stage 46 is a member corresponding to the stage 12 in FIGS. 1 and 2, and the substrate 100 is placed on the bonding stage. A mounting head 16 for mounting the semiconductor chip 102 is provided behind the bonding stage 46 when seen from the access opening 64. The mounting head 16 temporarily pressure-bonds a plurality of semiconductor chips 102 to one substrate 100 and then performs main pressure bonding on the plurality of temporarily pressure-bonded semiconductor chips 102. An alternating two dots-dashed arrow illustrated in FIG. 9 indicates a moving path of the mounting head 16 in a pressure-bonding process. As is apparent from FIG. 9, the mounting head 16 repeatedly performs an operation of continuously pressure-bonding the plurality of semiconductor chips 102 lined up in a substrate conveyance direction (Y direction) and an operation of shifting the semiconductor chips in a direction orthogonal to the substrate conveyance direction (X direction), and performs a pressure bonding process in a zigzag shape.

The mounting apparatus 10 is also provided with a film disposition mechanism 18 that interposes the cover film 110 between the mounting head 16 and the semiconductor chip 102 during a main pressure bonding process. The film disposition mechanism 18 is different from the film disposition mechanism 18 illustrated in FIGS. 1 and 2 in that two relay shafts 26a and 26b are provided in the course of a path of the cover film 110 and the cover film 110 is stretched in a substantially U shape when seen in a plan view.

More specifically, as illustrated in FIG. 9, in the present example, the first relay shaft 26a and the second relay shaft 26b are provided on both sides of the bonding stage 46 in the Y direction. Meanwhile, as a matter of course, the two relay shafts 26a and 26b are disposed so as not to interfere with the conveyance of the substrate 100. For example, in order not to interfere with the conveyance of the substrate 100, a bridge 70 crossing the substrate conveyance rail 38 may be provided, and the relay shafts 26a and 26b may be installed on the bridge 70. In addition, as another mode, a rail (not shown) extending in the X direction may be provided above the substrate conveyance rail 38, and the relay shafts 26a and 26b may be suspended and held from the rail. In any case, the two relay shafts 26a and 26b are disposed on both sides of the bonding stage 46, and the cover film 110 moving from the first relay shaft 26a to the second relay shaft 26b covers the semiconductor chips 102 of one column from above.

A feeding part 21 is provided on the side in front of the first relay shaft 26a in the X direction. The feeding part 21 is installed to be fixed to the base 14, and the position thereof is unchangeable. In addition, the rotation axis of the feeding reel 23 is parallel to the Y direction, and the cover film 110 is fed in the X direction. A configuration of the feeding part 21 is substantially the same as the configuration of the feeding part 21 described with reference to FIGS. 1, 2, and 5. The first relay shaft 26a is disposed such that the axial direction thereof is inclined at 45 degrees with respect to the rotation axis of the feeding reel 23. Therefore, the cover film 110 fed from the feeding part 21 moves with the X direction as a back side and is folded back by the first relay shaft 26a, whereby the moving direction thereof is bent by 90 degrees.

The second relay shaft 26b is disposed as a mirror image with respect to the first relay shaft 26a, and the two relay shafts 26a and 26b are disposed to form a substantially chevron shape when seen in a plan view. From another point of view, the second relay shaft 26b is disposed such that the axial direction thereof is inclined at 45 degrees with respect to the moving direction of the cover film 110 immediately before bending. For this reason, the moving direction of the cover film 110 folded back by the second relay shaft 26b is bent again by 90 degrees.

A recovery part 22 is provided on the front side of the second relay shaft 26b in the X direction. The recovery part 22 is also installed to be fixed to the base 14, and the position thereof is unchangeable. In addition, the rotation axis of the recovery reel 24 is parallel to the Y direction, and the cover film 110 moving in the X direction can wind around the recovery reel. A configuration of the recovery part 22 is also substantially the same as the configuration of the recovery part 22 described with reference to FIGS. 1, 2, and 5.

The film disposition mechanism 18 further includes a film movement mechanism 28 that moves the cover film 110 crossing the bonding stage 46 in the X direction. In the present example, when two relay shafts 26a and 26b are moved in the X direction, the cover film 110 is also moved in the X direction. For this reason, the film movement mechanism 28 is a mechanism that moves the two relay shafts 26a and 26b in the X direction. Such a mechanism can be configured by attaching, for example, a plate connected to the relay shafts 26a and 26b to a direct-acting mechanism. As the direct-acting mechanism, various known mechanisms can be used, and the direct-acting mechanism may include, for example, a pair of pulleys rotated by a motor and a timing belt stretched over the pulleys. In addition, the direct-acting mechanism may include a spline shaft rotated by a motor, a guide shaft extending in parallel with the spline shaft, and a moving block to which the spline shaft is screwed and into which the guide shaft is inserted. Further, as another mode, the direct-acting mechanism may include a linear motor, a hydraulic cylinder, an air cylinder, an electromagnetic cylinder, and the like. In any case, it is possible to change the position of the cover film 110 crossing the bonding stage 46 in the X direction by providing a movement mechanism moving the two relay shafts 26a and 26b in the X direction.

Here, as is apparent from the above description, in the present example, the positions of the feeding part 21 and the recovery part 22 are fixed, and only the two relay shafts 26a and 26b are moved horizontally. The relay shafts 26a and 26b are configured to be smaller and lighter than the feeding part 21 and the recovery part 22, and thus with such a configuration, the film movement mechanism 28 can be configured to be small and simple. In particular, in the present example, a pressure bonding process proceeds in a substrate conveyance direction (Y direction). In this case, it is necessary to stretch the cover film 110 so that the cover film 110 crosses the bonding stage 46 in the substrate conveyance direction (a direction in which the pressure bonding process proceeds). For this reason, in a case where the relay shaft 26 is not provided, the feeding part 21 and the recovery part 22 have to be disposed on both sides of the stage 12 in the substrate conveyance direction. However, in order to movably dispose the large and complicated feeding part 21 and recovery part 22 in the X direction on both sides of the bonding stage 46 so as not to interfere with the conveyance of the substrate 100, a complicated configuration is required, which tends to cause an increase in the size and cost of the mounting apparatus 10. In the present example, the small and light relay shafts 26a and 26b are disposed on both sides of the bonding stage 46, and thus such a problem can be solved.

In addition, as is apparent from FIG. 9, in the present example, the feeding part 21 and the recovery part 22 are disposed in front of the bonding stage 46 when seen from an access opening 64. With such a configuration, an operator can access the feeding part 21 or the recovery part 22 from the access opening 64 without crossing the bonding stage 46, and thus it is possible to easily perform maintenance work for the feeding part 21 and the recovery part 22.

Figure 10:
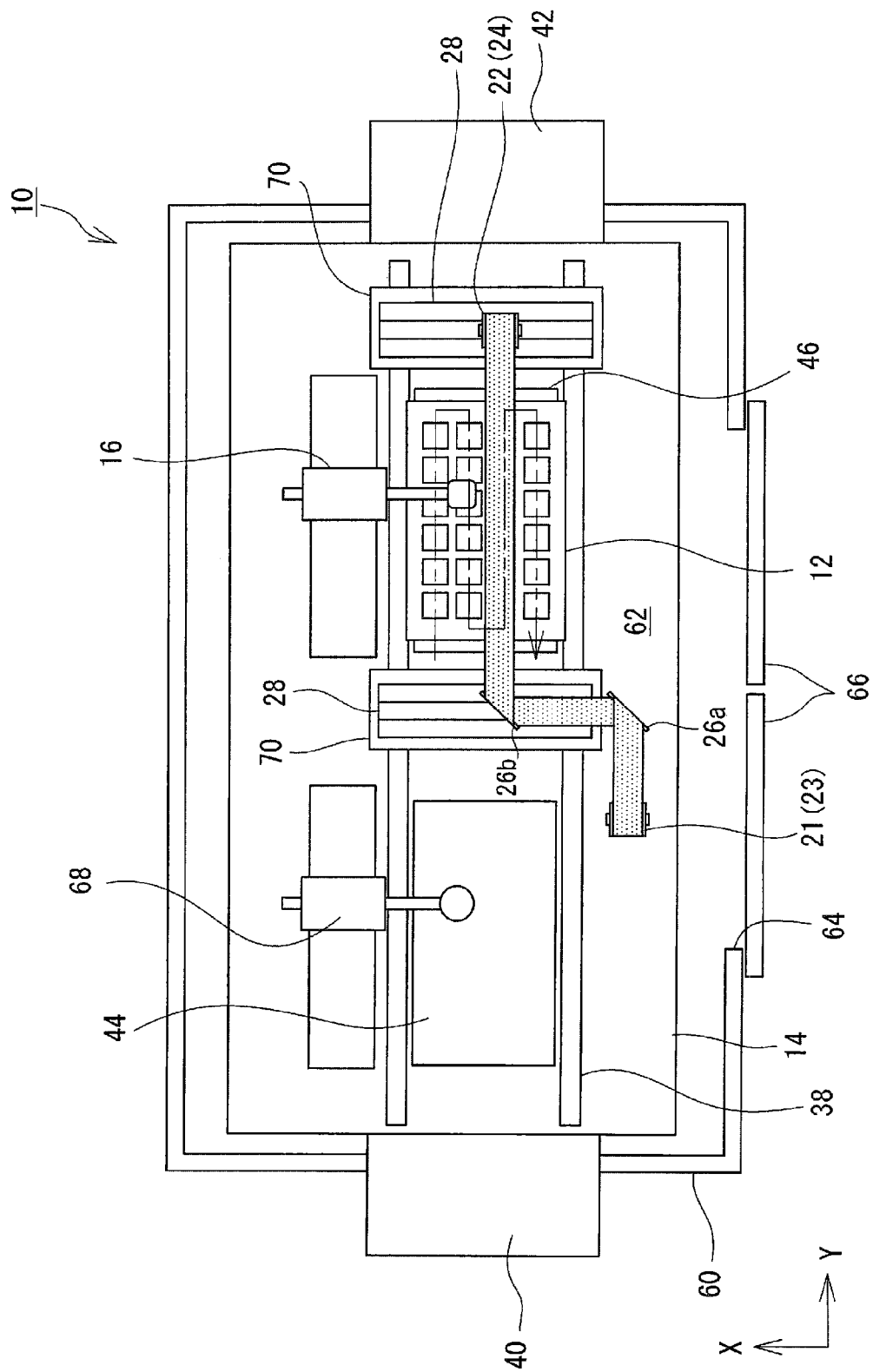
FIG. 10 is a schematic plan view of another mounting apparatus.

Meanwhile, all of the above-described configurations are examples, and the other configurations may be appropriately changed as long as at least the relay shaft 26 that bends the moving direction of the cover film 110 is provided in the course of the path of the cover film 110. Therefore, the number and disposition of the relay shafts 26, and the like may be appropriately changed. In addition, installation positions and configurations of the feeding part 21 and the recovery part 22 may be appropriately changed. Therefore, for example, as illustrated in FIG. 10, the second relay shaft 26b and the recovery part 22 are provided on both sides in the substrate conveyance direction with the bonding stage 46 interposed therebetween, and the first relay shaft 26a may be provided between the feeding part 21 and the second relay shaft 26b.

Further, in the above description, the relay shaft 26 is disposed to be inclined at 45 degrees with respect to the moving direction of the cover film 110 before and after bending, but the inclination of the relay shaft 26 may be appropriately changed. For example, the relay shaft 26 may be disposed to be inclined at 30 degrees with respect to the moving direction of the cover film 110 immediately before bending. In this case, the cover film 110 is folded back by the relay shaft 26, and thus the moving direction thereof is bent at 120 degrees. That is, in a case where an inclination angle of the relay shaft 26 is set to θ degrees, the cover film 110 is folded back by the relay shaft 26, and thus the moving direction thereof is bent by $(180-2\times\theta)$ degrees.

In addition, the feeding part 21 and the recovery part 22 may be appropriately changed as long as each of the parts includes at least the feeding reel 23 and the recovery reel 24. Therefore, the configurations of the feeding part 21 and the recovery part 22 are not limited to those illustrated in FIG. 5. Further, the mounting apparatus 10 may be appropriately changed as long as the mounting apparatus includes the mounting head 16, the stage 12, and the film disposition mechanism 18.

The invention claimed is:

1. A mounting apparatus for mounting a semiconductor chip on a mounting body, the mounting apparatus comprising:
   a stage on which the mounting body is placed and supported by a base;
   a mounting head which is provided to be movable up and down above the stage and presses the semiconductor chip against the mounting body;
   a film disposition mechanism which interposes a belt cover film between the mounting head and the stage; and
   a control part, wherein the mounting head is electrically coupled to the control part and the stage,
   wherein the film disposition mechanism includes
   a film feeding part which comprises a feeding reel around which the cover film has been wound, wherein the film feeding part is installed to be fixed to the base,
   a film recovery part which comprises a recovery reel winding up the fed cover film, wherein the film recovery part is installed to be fixed to the base, and
   a relay shaft which is provided in the course of a path of the cover film from the feeding reel to the recovery reel and by which the cover film is folded back in order to bend a moving direction of the cover film, the relay shaft extending in a direction in which an axial direction of the relay shaft is inclined with respect to a moving direction immediately before bending of the cover film,
   wherein the stage directly coupled to top of the base and spaced apart from the feeding reel, the recovery reel and relay shaft.

2. The mounting apparatus according to claim 1, wherein the relay shaft is disposed in a manner of the axial direction being inclined at 45 degrees with respect to the moving direction of the cover film immediately before bending.

3. The mounting apparatus according to claim 1, wherein the mounting apparatus comprises an access opening for allowing an operator to access a mounting execution space, and
both the film feeding part and the film recovery part are not disposed behind the stage when seen from the access opening.

4. The mounting apparatus according to claim 3, wherein the film disposition mechanism further comprises a film movement mechanism for moving at least two of the film feeding part, the relay shaft, and the film recovery part in a horizontal direction in order to move the cover film crossing the stage in a horizontal direction.

5. The mounting apparatus according to claim 1, wherein the film disposition mechanism further comprises a film movement mechanism for moving at least two of the film feeding part, the relay shaft, and the film recovery part in a horizontal direction in order to move the cover film crossing the stage in a horizontal direction.

6. The mounting apparatus according to claim 5, wherein the relay shaft includes a first relay shaft and a second relay shaft which are disposed on both sides of the stage in a first direction,
both the first relay shaft and the second relay shaft are disposed such that axial directions of the first and second relay shafts are inclined at 45 degrees with respect to
the moving direction of the cover film immediately before bending, and the film disposition mechanism moves the first relay shaft and the second relay shaft in association with each other in the same direction as a second direction orthogonal to the first direction.

7. The mounting apparatus according to claim 6, wherein the cover film forms substantially a U shape moving from the feeding reel to the recovery reel via the first relay shaft and the second relay shaft, and the feeding reel and the recovery reel are disposed to be spaced apart from each other in the second direction.

* * * * *